United States Patent [19]

Aota

[11] Patent Number: 4,607,237
[45] Date of Patent: Aug. 19, 1986

[54] TEMPERATURE-COMPENSATED CRYSTAL OSCILLATOR CIRCUIT

[75] Inventor: Toshio Aota, Soma, Japan

[73] Assignee: Alps Electric Co., Ltd., Japan

[21] Appl. No.: 800,055

[22] Filed: Nov. 20, 1985

[30] Foreign Application Priority Data

Nov. 21, 1984 [JP] Japan .................... 59-246846

[51] Int. Cl.$^4$ .................. H03B 5/36; H03L 1/04
[52] U.S. Cl. .................. 331/116 R; 331/158; 331/176; 331/177 V
[58] Field of Search .......... 331/66, 116 R, 116 FE, 331/154, 158, 176, 177 V

[56] References Cited

U.S. PATENT DOCUMENTS

| | | | |
|---|---|---|---|
| 3,527,693 | 2/1976 | Waku | 331/116 R |
| 3,641,461 | 2/1972 | Mrozek | 331/116 R |
| 4,063,194 | 12/1977 | Helle | 331/177 V X |

Primary Examiner—Eugene R. LaRoche
Assistant Examiner—D. C. Mis
Attorney, Agent, or Firm—Guy W. Shoup

[57] ABSTRACT

A crystal oscillator circuit that is temperature compensated over a broad temperature range has a crystal oscillator, a reactance compensation circuit for providing temperature compensation at low temperatures, and a control voltage-generating circuit for providing temperature compensation at high temperatures. The reactance compensation circuit includes the parallel combination of a thermistor and a variable-capacitance diode, and this parallel combination is connected in series with the crystal oscillator. The control voltage-generating circuit includes a thermistor and transistors and applies a voltage corresponding to the ambient temperature to the variable-capacitance diode of the reactance compensation circuit.

4 Claims, 9 Drawing Figures

TEMPERATURE-COMPENSATED CRYSTAL OSCILLATOR CIRCUIT

FIELD OF THE INVENTION

The present invention relates to a temperature-compensated crystal oscillator circuit and, more particularly, to a crystal oscillator circuit which uses a crystal oscillator and which is temperature compensated.

BACKGROUND OF THE INVENTION

As a temperature-compensated crystal oscillator circuit using a crystal oscillator for obtaining a stable frequency, a Colpitts oscillator circuit 4 as shown in FIG. 8 is available. Since this circuit 4 oscillates when crystal oscillator X exhibits inductive impedance, a variable capacitance diode $VD_2$ is connected in series with the oscillator X. A control voltage $V_D$ which is produced using thermistors $TH_3$ and $TH_4$ as temperature transducers is applied across the diode $VD_2$ to produce a temperature-compensated oscillation frequency. Because the control voltage $V_D$ is applied across the diode $VD_2$ over the whole temperature range in which compensation is made, the range depends upon the temperature characteristics of the thermistors $TH_3$ and $TH_4$. Therefore, as shown in FIG. 9 which is the same as FIG. 10 of Japanese Patent Publication No. 34091/1972, the temperature characteristic of the thermistor $TH_3$ differs widely from that of the thermistor $TH_4$ at low temperatures. In FIG. 9, the curves indicated by the circled dots and the broken line are obtained under the conditions of designed values m=0.85 and m=1, respectively. This gives rise to error in the control voltage which is generated for temperature compensation. Hence, it is difficult to provide temperature compensation over a broad temperature range, as for example, from −30° C. to +70° C. More specifically, if such an error should be minimized, each different resistance value is selected for each individual oscillator circuit in a quite cumbersome manner. Also, if the crystal oscillator is kept at a constant temperature, a large amount of electric power is consumed, making low consumption of electric power unfeasible.

SUMMARY OF THE INVENTION

In view of the foregoing problems with the prior art technique, it is the main object of the present invention to provide a crystal oscillator circuit which is temperature compensated over a broad temperature range.

The above object is achieved by a crystal oscillator circuit which, at high temperatures, is temperature compensated using a control voltage applied across a variable-capacitance diode or the like and which, at low temperatures, is temperature compensated by controlling the combined reactance of the variable-capacitance diode and other devices, thereby producing a temperature-compensated frequency.

Specifically, this temperature-compensated crystal oscillator circuit using a crystal oscillator comprises a reactance compensation circuit for providing temperature compensation at low temperatures and a control voltage-generating circuit for providing temperature compensation at high temperatures. The reactance compensation circuit includes the parallel combination of a temperature transducer and a variable-capacitance device, the parallel combination being connected in series with the crystal oscillator. The control voltage-generating circuit applies a control voltage corresponding to the ambient temperature of the crystal oscillator to the variable-capacitance device.

Other objects and features of the invention will appear in the course of description thereof that follows.

DETAILED DESCRIPTION OF THE INVENTION

Figure 1:
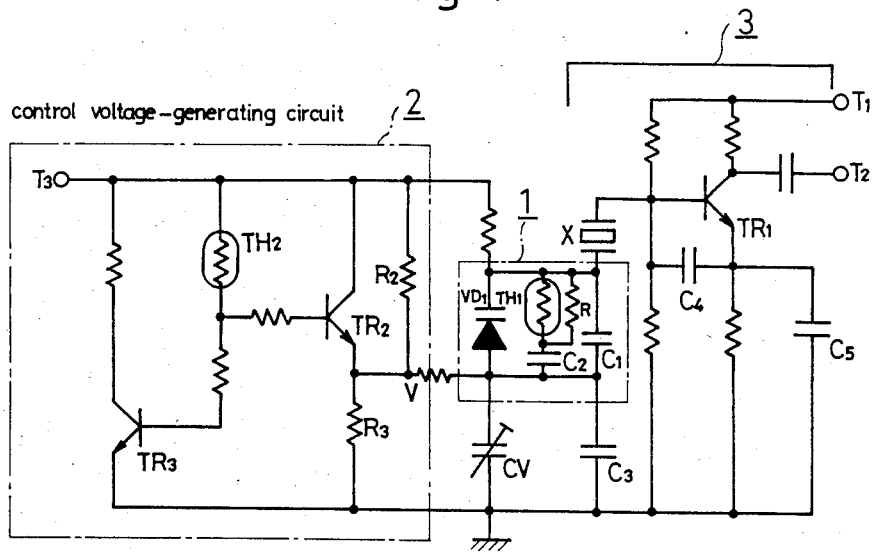
FIG. 1 is a diagram of a crystal oscillator circuit according to the present invention.

Referring to FIG. 1, there is shown a temperature-compensated crystal oscillator circuit embodying the concept of the invention. This circuit has a reactance compensation circuit 1, a control voltage-generating circuit 2, a Colpitts oscillator circuit 3, resistors R, $R_2$, $R_3$, variable-capacitance diodes $VD_1$, $VD_2$, thermistors $TH_1$–$TH_4$, capacitors $C_1$–$C_5$, and transistors $TR_1$–$TR_3$.

The reactance compensation circuit 1 acts to provide temperature compensation at low temperatures. More specifically, as temperature varies, the series resistance to the thermistor $TH_1$ changes to thereby compensate for the reactance or capacitance of the Colpitts oscillator circuit 3. As a result, the frequency is maintained at a constant value.

The control voltage-generating circuit 2 provides temperature compensation at high temperatures. As temperature varies, the series resistance to the thermistor $TH_2$ changes, producing a control voltage at the emitter of the transistor $TR_2$. This voltage is applied to the variable-capacitance diode $VD_1$ so that the capacitance of the Colpitts oscillator circuit 3 is compensated. As a result, the frequency is retained at a constant value.

Figure 2:
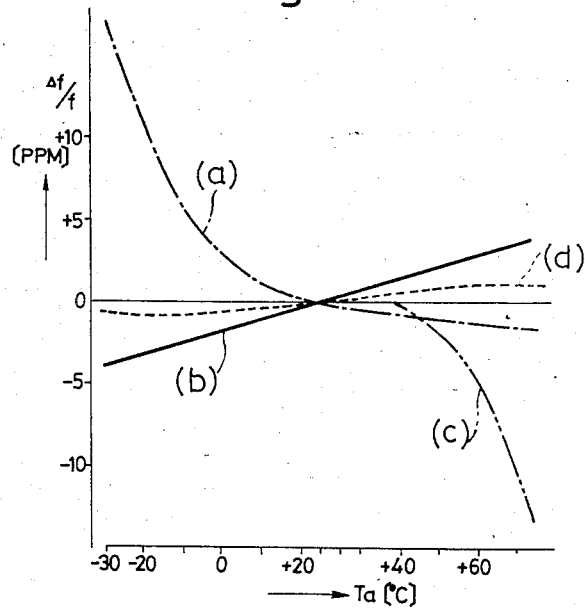
FIG. 2 is a graph showing the frequency characteristics of the circuit shown in FIG. 1.
Figure 3:
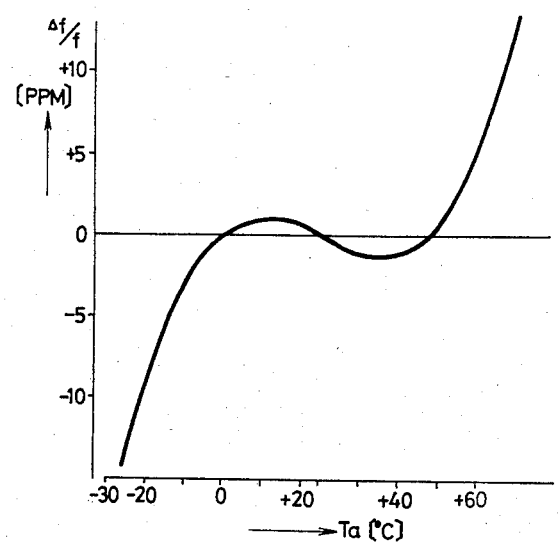
FIGS. 3-7 are graphs for illustrating the operation of the circuit shown in FIG. 1.
Figure 7:
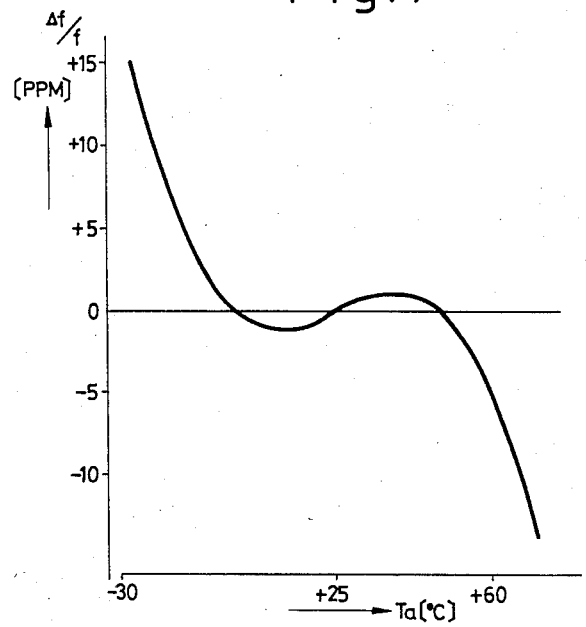
Figure 8:
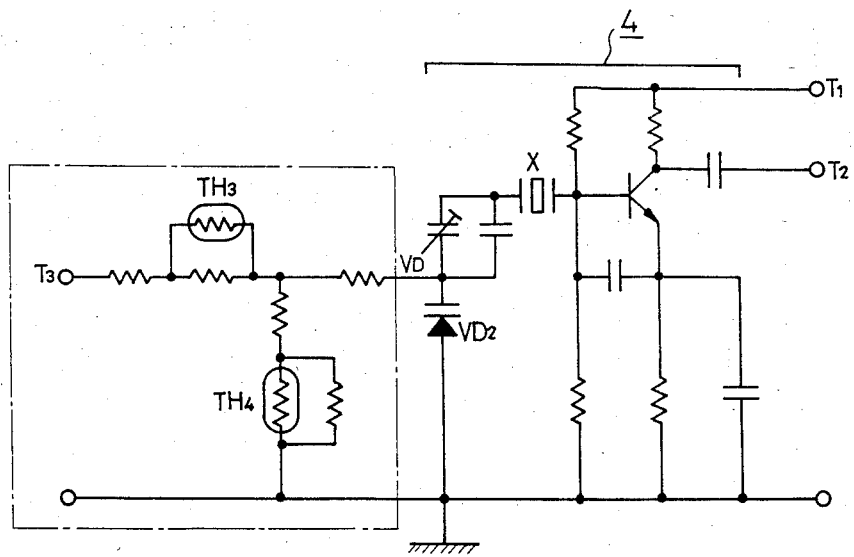
FIG. 8 is a diagram of a conventional temperature-compensated crystal oscillator circuit.
Figure 9:
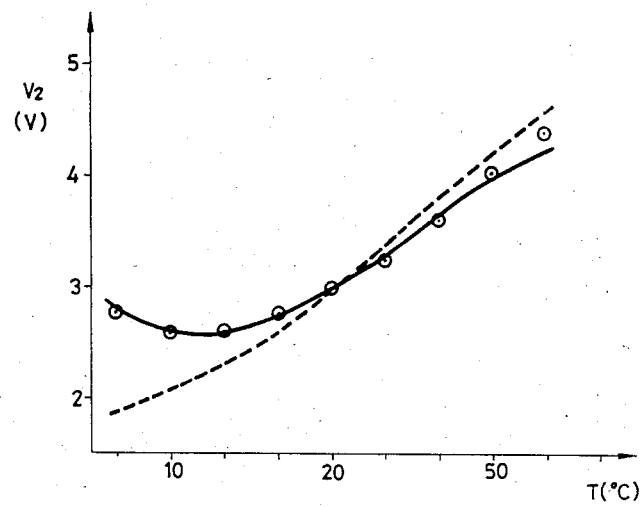
FIG. 9 is a graph of the frequency characteristic of the circuit shown in FIG. 8.

The capacitors $C_3$–$C_5$ are used to provide temperature compensation at middle temperatures. They have a negative coefficient. That is, their capacitance decreases as temperature increases. The Colpitts oscillator circuit 3 is temperature compensated by these capacitors. The temperature compensations provided for for low, middle, and high temperature ranges are indicated by curves (a), (b), and (c), respectively, in FIG. 2, where frequency variation Δf/f is plotted against temperature (°C.). The cubic curve shown in FIG. 7 is obtained by combining together these curves (a), (b), (c). This temperature-compensating curve will be described in detail later. This curve has the waveform that compensates the cubic curve which represents the relation of the frequency variation Δf/f of an AT-cut crystal oscillator to temperature as shown in FIG. 3. This AT-cut crystal oscillator will also be described in detail later. As a result, the oscillation frequency varies little over a broad frequency range, for example, from −30° C. to +70° C. as indicated by curve (d) in FIG. 2.

Referring specifically to FIG. 1, the reactance compensation circuit 1 is composed of variable-capacitance diode $VD_1$, thermistor $TH_1$, resistor R, and capacitors $C_1$, $C_2$ which are connected as shown. This circuit 1 is inserted between a crystal oscillator X constituting the Colpitts oscillator circuit 3 and ground. The compensation circuit 1 provides temperature compensation for the characteristic of the AT-cut crystal oscillator X shown in FIG. 3 at low temperatures as previously mentioned. The combined equivalent load capacitance $C_L$ is given by $$C_L = \frac{\frac{(R_1R)^2}{(R_1+R)^2} + \frac{(1/(C_1+C_J)+1/C_2)^2}{\omega^2}}{\frac{(R_1R)^2}{(R_1+R)^2} + \frac{1/(C_1+C_J)+1/C_2}{\omega^2(C_1+C_J)C_2}} \quad (1)$$

$$R_1 = R_{25} \exp B(1/T_1 - 1/T_2) \quad (2)$$

where $R_1$ is the internal resistance of the thermistor $TH_1$, and $C_J$ is the junction capacitance of the variable-capacitance diode $VD_1$. The circuit is so designed that the junction capacitance $C_J$ and the internal resistance $R_1$ included in equation (1) above follow changes in the ambient temperature. Thus, the equivalent load capacitance $C_L$ changes, resulting in curve (a) shown in FIG. 2. Consequently, the oscillation frequency produced by the Colpitts oscillator circuit 3 is maintained at a constant value at low temperatures.

Figure 4A:
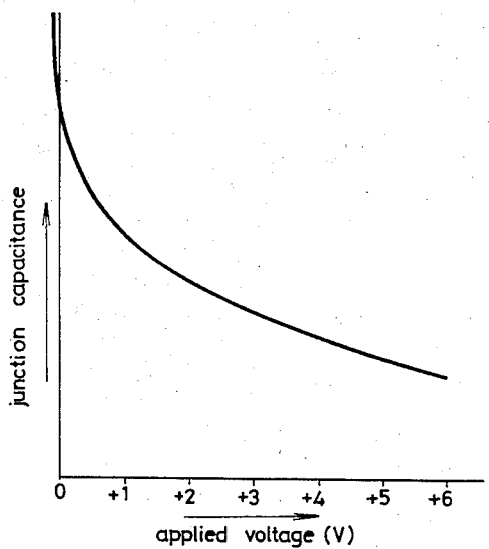
Figure 4B:
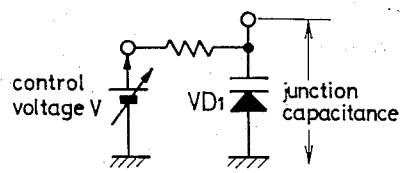

Referring still to FIG. 1, the control voltage-generating circuit 2 is composed of thermistor $TH_2$, transistors $TR_2$ and $TR_3$, resistors $R_2$ and $R_3$, etc. which are connected as shown. The circuit 2 controls the voltage applied to the variable-capacitance diode $VD_1$ to control the frequency of the Colpitts oscillator circuit 3. The circuit 2 provides temperature compensation for the characteristic of the AT-cut crystal oscillator X shown in FIG. 3 at high frequencies as already mentioned, and it creates a characteristic as given by curve (c) shown in FIG. 2. More specifically, the control voltage V is applied to the variable-capacitance diode $VD_1$ using the arrangement shown in FIG. 4(b). In this case, the junction capacitance of the diode $VD_1$ varies as indicated by the curve of FIG. 4(a).

Figure 5:
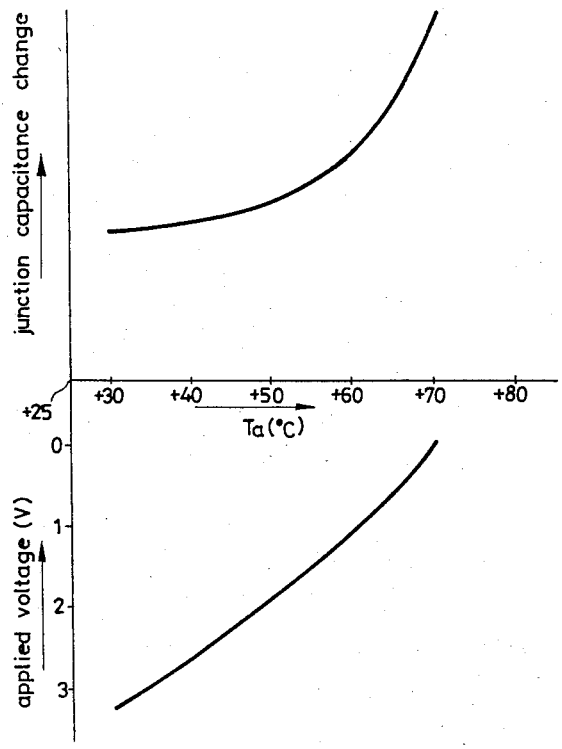
Figure 5:
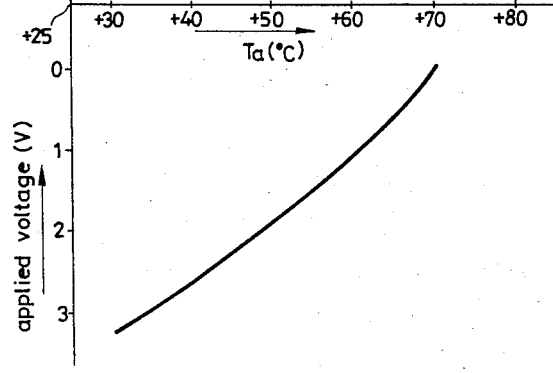
Figure 6:
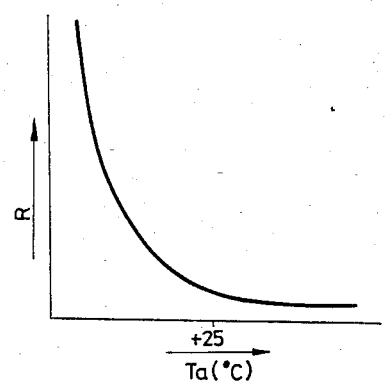

The relation of capacitance change needed for the temperature compensation in a high temperature range, for example, from +40° C. to +70° C., to temperature is represented by the curve shown in FIG. 5(a). The voltage necessary for producing the capacitance given by the curve shown in FIG. 5(a) can be obtained using the aforementioned curve shown in FIG. 4(a). The obtained curve is shown in FIG. 5(b). The relation of the resistance value of the thermistor $TH_2$ to temperature $T_a$ (°C.) is given by the curve shown in FIG. 6. Thus, using the control voltage-generating circuit 2 of the structure shown in FIG. 1, we obtain the relation of frequency variation $\Delta f/f$ to temperature as given by curve (c) in FIG. 2. The ratio of the resistance $R_2$ to the resistance $R_3$ is appropriately selected to set the offset so that the control voltage-generating circuit 2 may be set in motion when the temperature becomes 40° C. or higher as indicated by curve (c) shown in FIG. 2.

The capacitors $C_3$–$C_5$ having negative temperature coefficient are arranged as shown in FIG. 1. Thus, the frequency variation $\Delta f/f$ can be increased as temperature increases as indicated by curve (b) shown in FIG. 2. Consequently, the characteristic of the whole configuration shown in FIG. 1 is stable against temperature changes as represented by curve (d) shown in FIG. 2.

As thus far described, in the novel circuit, temperature compensation is provided by the use of the control voltage applied to the variable-capacitance diode or the like at high temperatures. At low temperatures, the combined reactance of the variable-capacitance diode and other devices is controlled to provide temperature compensation. Consequently, the oscillation frequency is temperature compensated over a broad frequency range. Since temperature compensation is made separately for high, middle, and low temperature ranges, the temperature compensation can be applied to crystal oscillators having any temperature characteristic. Hence, the oscillator circuit delivers a quite stable frequency without being affected by variations among characteristics of temperature transducers and other devices.

What is claimed is:

1. A temperature-compensated crystal oscillator circuit using a crystal oscillator whose oscillation frequency is maintained constant against temperature changes, the temperature-compensated crystal oscillator circuit comprising:
    a reactance compensation circuit for providing temperature compensation for the crystal oscillator at low temperatures, the compensation circuit including at least the parallel combination of a temperature transducer and a variable-capacitance device, the parallel combination being connected in series with the crystal oscillator; and
    a control voltage-generating circuit that applies a control voltage corresponding to the ambient temperature of the crystal oscillator to the variable-capacitance device for providing temperature compensation for the crystal oscillator at high temperatures.

2. A temperature-compensated crystal oscillator circuit as set forth in claim 1, wherein the temperature transducer is a thermistor and the variable-capacitance device is a variable-capacitance diode.

3. A temperature-compensated crystal oscillator circuit as set forth in claim 1, wherein the control voltage-generating circuit includes a thermistor and transistors.

4. A temperature-compensated crystal oscillator circuit as set forth in claim 1, further comprising capacitors having negative temperature coefficient of capacitance for providing temperature compensation at middle temperatures.

* * * * *